United States Patent
Lu et al.

(10) Patent No.: US 11,264,461 B2
(45) Date of Patent: Mar. 1, 2022

(54) GRAPHENE ELECTROCHEMICAL TRANSFER METHOD ASSISTED BY MULTIPLE SUPPORTING FILMS

(71) Applicant: THE INSTITUTE OF MICROELECTRONICS OF CHINESE ACADEMY OF SCIENCES, Beijing (CN)

(72) Inventors: Weier Lu, Beijing (CN); Yang Xia, Beijing (CN); Lili Zhao, Beijing (CN); Nan Li, Beijing (CN)

( * ) Notice: Subject to any disclaimer, the term of this patent is extended or adjusted under 35 U.S.C. 154(b) by 106 days.

(21) Appl. No.: 16/648,242

(22) PCT Filed: Feb. 28, 2019

(86) PCT No.: PCT/CN2019/076397
§ 371 (c)(1),
(2) Date: Mar. 18, 2020

(87) PCT Pub. No.: WO2020/042556
PCT Pub. Date: Mar. 5, 2020

(65) Prior Publication Data
US 2020/0235212 A1    Jul. 23, 2020

(30) Foreign Application Priority Data
Aug. 30, 2018  (CN) .......................... 201811005282.9

(51) Int. Cl.
*H01L 29/16* (2006.01)
*C01B 32/194* (2017.01)
*B32B 37/00* (2006.01)

(52) U.S. Cl.
CPC ........ *H01L 29/1606* (2013.01); *B32B 37/025* (2013.01); *C01B 32/194* (2017.08); *C01B 2204/04* (2013.01); *C01B 2204/22* (2013.01)

(58) Field of Classification Search
CPC .............. H01L 29/1606; C01B 32/194; C01B 2204/04; C01B 2204/22; C25F 3/00; B32B 37/025
(Continued)

(56) References Cited

U.S. PATENT DOCUMENTS

| 2014/0087191 A1* | 3/2014 | Chua .................. H01L 21/2007 428/408 |
| 2017/0032962 A1 | 2/2017 | Zurutuza Elorza et al. |

FOREIGN PATENT DOCUMENTS

| CN | 102583356 A * | 7/2012 | ............... C25B 1/00 |
| CN | 102719803 A | 10/2012 | |

(Continued)

OTHER PUBLICATIONS

International search report of PCT/CN2019/076397.
International search report of PCT/CN2019/076397, dated May 2019.

*Primary Examiner* — Tri V Nguyen

(57) ABSTRACT

Disclosed is a graphene electrochemical transfer method assisted by multiple supporting films, comprising: (1) growing graphene on a substrate, and then spin-coating a thin layer of photoresist on a surface of the graphene as a first film; (2) spin-coating n layers of thick, tough, and selectively dissolvable polymer films on the surface of the first film as an top film; (3) dissociating the multi-layer composite film and the graphene from the surface of the substrate by an electrochemical process, and dissolving the thick polymer films which is the top film with a first solvent; (4) after cleaning, transferring the thin first film and the graphene to a target substrate, and finally dissolving the thin first film away with a second solvent to complete the transfer process. This transfer process is fast, stable, and capable of transferring a large-size graphene, which may promote the large-scale application of graphene.

17 Claims, 3 Drawing Sheets

(58) Field of Classification Search
USPC .................. 428/408; 427/109, 112; 977/847
See application file for complete search history.

(56) References Cited

FOREIGN PATENT DOCUMENTS

CN 102719877 A 10/2012
WO WO-2017040469 A1 * 3/2017 ............. C03C 17/22

* cited by examiner

GRAPHENE ELECTROCHEMICAL TRANSFER METHOD ASSISTED BY MULTIPLE SUPPORTING FILMS

TECHNICAL FIELD

The present application relates to a graphene electrochemical transfer method assisted by multiple supporting films, and belongs to the technical field of two-dimensional materials.

BACKGROUND OF THE INVENTION

Graphene is a two-dimensional material with a hexagonal honeycomb structure arranged in a single atomic layer. Due to its special nanostructure as well as electrical and thermodynamic properties, such as high mechanical strength, high thermal conductivity, large specific surface area and high electron mobility and the like, graphene has shown great application potential in the fields of micro/nano electronic devices, photoelectric catalysis, biosensors and fuel cells, etc., and has become an international research hotspot in recent years.

With a chemical vapor deposition process, large-size, high-quality graphene single crystals can be manufactured, and the mobility of the single crystals is close to that of a graphene stripped from a highly oriented pyrolytic graphite. Therefore, the chemical vapor deposition process has become the most promising graphene manufacture process in the field of micro/nano electronic devices. At present, the key to restrict the large-scale applications of chemical vapor deposition graphene is the high-performance graphene transfer method. Conventional graphene transfer technologies are divided into copper substrate wet etching transfer technology and electrochemical stripping technology.

The transfer process of the copper substrate etching method is to first spin-coat a layer of a PMMA film on a surface of a copper substrate on which graphene has been grown, then etch away the copper substrate in an etchant solution, and after washing, transfer the PMMA/graphene to a surface of a target substrate, and finally dissolve the PMMA to complete the transfer process. Commonly used etchant includes iron chloride, iron nitrate, potassium persulfate, ammonium persulfate, and the like. In the copper etching transfer method, the etching process of copper is relatively slow, taking more than 5 hours, which is prone to cause defects, and cause unavoidable defects such as residues of metallic iron and copper as well as doping of graphene. The etching of copper substrate is also wasteful. For inert noble metal substrates, such as Pt substrates, the etching method is obviously not applicable.

In the electrochemical transfer method, water can be electrolyzed by using PMMA/graphene/metal-substrate as a cathode, and glassy carbon electrode or platinum as an anode. The cathode undergoes a reduction reaction to generate hydrogen bubbles on the surfaces of the graphene and the metal substrate to strip them from each other. The electrochemical transfer method has a fast stripping process, which only takes a few minutes, and does not need to corrode the metal substrate, such that the metal substrate can be recycled and reused, which is environmentally friendly and economical, and there is no residues of metal impurities. However, with the electrochemical transfer method, the stripping is based on the hydrogen bubbles generated by electrolysis occurred between the metal substrate and the graphene. In a conventional electrochemical transfer process, after the electrolysis is completed, the PMMA/graphene is transferred to deionized water for washing, and then transferred to a surface of a target substrate after washing. Hydrogen gas bubbles are easily present on the graphene surface, which affects the close adhesion of the graphene to the target substrate, and ultimately leads to breakage of the graphene.

SUMMARY OF THE INVENTION

The present disclosure is intended to provide a graphene electrochemical transfer method assisted by multiple supporting films, whereby the problems that the existing transfer processes are susceptible to cause defects such as metal residues, holes, and wrinkles on the graphene surface, are solved. The electrochemical transfer method assisted by multiple supporting films of the present disclosure has a faster transfer process and can avoid metal residues as compared to the substrate etching method. Compared with the traditional electrochemical transfer method, bubbles can be removed and residues of impurities can be cleaned, directly and simply, by the use of a thick multi-support film. Additionally, it can be ensured that the graphene has a good contact with the target substrate, by selectively dissolving the upper thick supporting film and retaining only the single thin supporting film, before the graphene being transferred to the substrate, whereby the quality of thin film transferred by graphene was improved and the repeatability of the transfer process was achieved.

The present disclosure provides a graphene electrochemical transfer method assisted by multiple supporting films, comprising:

(1) growing graphene on a substrate, and then spin-coating a thin layer of photoresist on a surface of the graphene as a first film;

(2) spin-coating n layers of thick, tough, and selectively dissolvable polymer films on the surface of the first film as an top film, where $1 \leq n \leq 10$;

(3) dissociating the multi-layer composite film and the graphene from the surface of the substrate by an electrochemical method, and dissolving the thick polymer films which are the top film with a first solvent;

(4) After washing, transferring the thin first film and the graphene to the target substrate, and finally dissolving the thin first film away with the use of a second solvent to complete the transfer process.

The term "graphene" as used in the present disclosure refers to a single-layer or multi-layer graphene grown on a surface of a metal substrate by chemical vapor deposition (CVD).

The term "composite film" as used in the present disclosure refers to a collection of all films spin-coated on a surface of graphene.

The graphene electrochemical transfer method assisted by multiple supporting films according to the present disclosure, wherein in step (1), a thin layer of photoresist was spin-coated for use as a protective film for graphene transfer.

The graphene electrochemical transfer method assisted by multiple supporting films according to the present disclosure, wherein the metal substrate is Cu, Ni, Co, Ir, Ru, Pd, Pt, an alloy thereof, or the like.

In some embodiments, the metal substrate is Cu.

The graphene electrochemical transfer method assisted by multiple supporting films according to the present disclosure, wherein the first thin layer of photoresist includes polymethyl methacrylate (PMMA), polybisphenol A, carbonate (PC), or a double-layer film of polyvinyl alcohol (PVA) and PMMA.

In some embodiments, the first thin layer of photoresist is a PMMA film.

The graphene electrochemical transfer method assisted by multiple supporting films according to the present disclosure, wherein the thickness of the first thin layer of photoresist is 100 nm-1000 nm.

In some embodiments, the thickness of the first thin layer of photoresist is about 200 nm.

The graphene electrochemical transfer method assisted by multiple supporting films according to the present disclosure, wherein the top film can be selectively dissolved, that is, the solvent that can dissolve the top film would not dissolve the first thin layer of photoresist.

The graphene electrochemical transfer method assisted by multiple supporting films according to the present disclosure, wherein the top film includes polystyrene (PS) or dimethylsiloxane (PDMS), and polystyrene (PS) is preferred.

The graphene electrochemical transfer method assisted by multiple supporting films according to the present disclosure, wherein the thickness of the top film is 1-100 um.

In some embodiments, the thickness of the top film is about 1 um.

The graphene electrochemical transfer method assisted by multiple supporting films according to the present disclosure, wherein in step (3), the electrolyte used in the electrochemical method for electrochemically stripping includes the aqueous solutions of $Na_2SO_4$, NaCl, NaOH, $K_2SO_4$, KCl or KOH; with electrolysis voltage of 2-20 V.

In some embodiments, the electrolyte is $Na_2SO_4$ aqueous solution; and the electrolysis voltage is 3-4 V.

The graphene electrochemical transfer method assisted by multiple supporting films according to the present disclosure, wherein the first solvent is a solvent capable of dissolving the top film without dissolving the first film; and cyclohexene is preferred.

The graphene electrochemical transfer method assisted by multiple supporting films according to the present disclosure, wherein the target substrate is a substrate including $Si/SiO_2$, polymer, or BN, and the like.

In some embodiments, the target substrate is $Si/SiO_2$.

The graphene electrochemical transfer method assisted by multiple supporting films according to the present disclosure, wherein the second solvent is a solvent capable of dissolving the first film; and acetone is preferred.

The graphene electrochemical transfer method assisted by multiple supporting films of the present disclosure has the following beneficial effects:

1. With the method assisted by multiple supporting films of the present disclosure, the transfer process was speeded up, and the occurrence of residues of metal impurities caused by corroding metal substrates and using etchant containing metal ions was avoided.

2. The multiple supporting films/graphene, by using the method assisted by multiple supporting films of the present disclosure, can be lifted directly and simply out of the liquid surface of the solvent with tweezers, and then immersed and floated in clean deionized water for washing. In the process set forth above, the residual electrolyte ions were cleaned and the bubbles adhering to the surface of the graphene were removed, with the occurrence of holes and breakage defects of the graphene obtained by the transfer process being reduced, and the quality of the film transferred by graphene being improved.

3. It can be ensured that the graphene has a good contact with the target substrate, by selectively dissolving the upper thick supporting film and retaining only the first thin supporting film/graphene attached to the target substrate, before the multiple supporting films/graphene being transferred to the target substrate, whereby the occurrence of wrinkles and breakage defects were reduced.

4. The graphene obtained by using the transfer method of the present disclosure has high-quality and few defects. This transfer process is fast, stable, and capable of transferring a large-size graphene, which may promote the large-scale application of graphene.

DETAILED DESCRIPTION OF THE INVENTION

Hereinafter the present disclosure will be described in more detail in combination with the detailed description and embodiments, thereby the advantages and various effects of the present disclosure will be more clearly presented. Those skilled in the art should understand that these detailed description and examples are intended to illustrate the present disclosure, and not as restrictive.

Throughout the specification, unless specifically stated otherwise, the terms as used herein should be construed as the meaning in any way as commonly used in the art. Therefore, unless defined otherwise, all technical and scientific terms used herein generally have the same meaning as commonly understood by one of ordinary skill in the art to which this invention disclosure belongs.

In case of contradict, this specification takes precedence.

Figure 1:
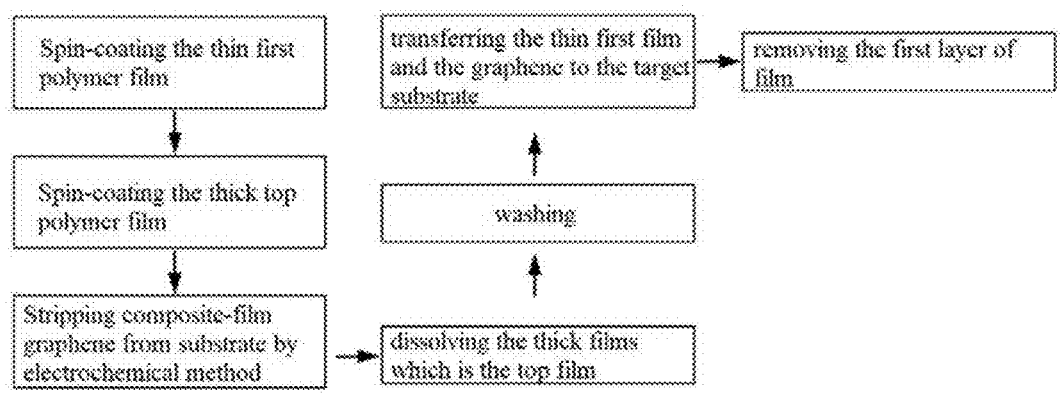
FIG. 1 illustrates a flowchart of a graphene electrochemical transfer method assisted by multiple supporting films according to the present disclosure.

FIG. 1 illustrates a flowchart of an electrochemical transfer method assisted by multiple supporting films according to the present disclosure. Firstly, the graphene was grown on a substrate; and then a thin layer of photoresist was spin-coated on a surface of the graphene as a protective film (a first film) for the transfer of the graphene; followed by n layers of thick, tough and selectively dissolvable polymer films were spin-coated on a surface of the first film as an top film, where $1 \leqslant n \leqslant 10$; then the multi-layer composite film and the graphene were dissociated from the substrate surface by an electrochemical method; and the top thick polymer film was dissolved away with the first solvent; after being washed, the thin first film and the graphene were transferred to the target substrate; finally the first thin protective film was dissociated away with the second solvent, thus the transfer process was completed.

The specific steps were as follows:

S1: growing a single layer or multiple layers of graphene on a surface of a Cu substrate by a chemical vapor deposition process, and spin-coating thereon a thin PMMA film with a thickness of about 200 nm.

S2: spin-coating a thick, tough and selectively soluble PS film as an top film on the surface of the PMMA film;

wherein, the preparation process of the top PS film were as follows: dissolving PS polymer particles in 1-methyl-1-cyclohexene, with a mass-volume ratio of 5%, a spin-coating speed of the homogenizer being 2000 rpm/min, and a spin-coating time being 50 seconds, and the thickness of the spin-coated film being about 1 micron. The resulting mixture was placed in a vacuum dryer for 1 hour until the solvent was well evaporated, followed by the electrochemical transfer for next step.

Figure 2:
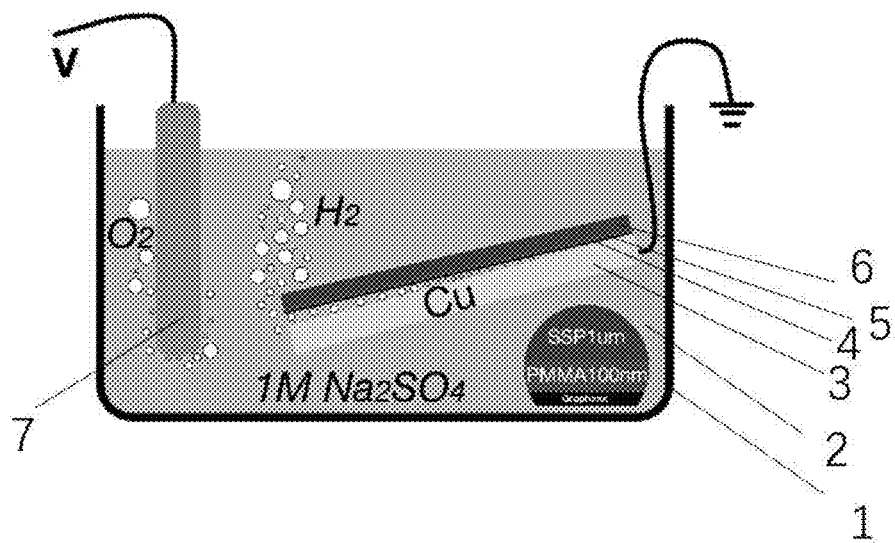
FIG. 2 illustrates a schematic diagram of an electrolytic peeling process according to an embodiment of the present disclosure.

The method may further comprise step S3: The electrolyte for electrochemically stripping is a $Na_2SO_4$ aqueous solution with a concentration of 1 mol/L; wherein, the electrolysis voltage is 3V; the anode is a Pt electrode; the cathode is a composite structure sample composed of a Cu substrate and a graphene polymer film. The schematic diagram of the electrolysis process is shown in FIG. 2. In FIG. 2, ref.1 indicates an electrolytic cell, ref.2 indicates an electrolyte solution, ref.3 indicates a copper substrate for graphene growth, ref.4 indicates graphene, ref.5 indicates PMMA, ref.6 indicates a PS film, and ref.7 indicates a platinum anode.

Figure 3:
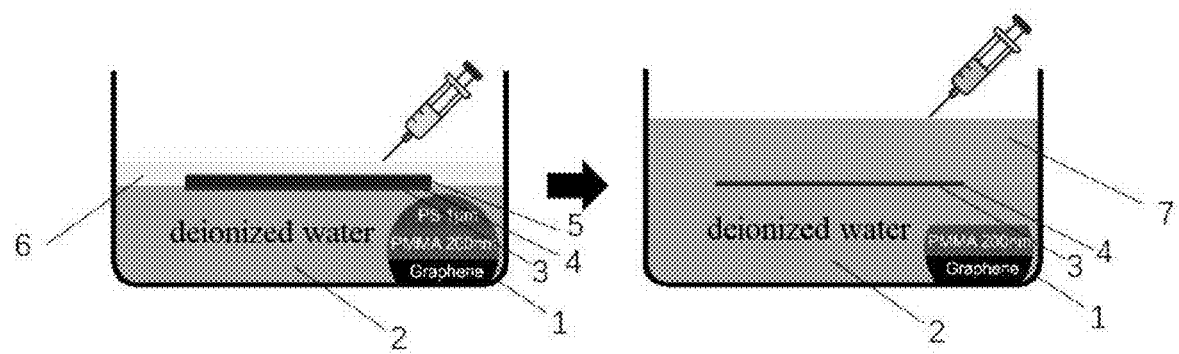
FIG. 3 illustrates a schematic diagram of a dissolution process of an upper supporting film according to an embodiment of the present disclosure.
Figure 4:
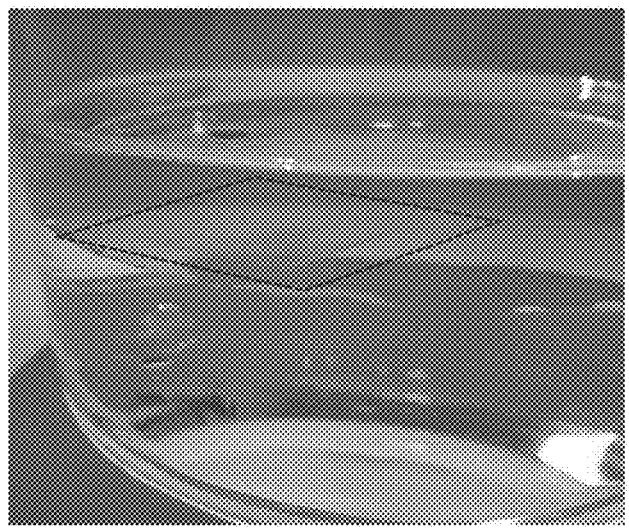
FIG. 4 illustrates a photo of dissolution process of an upper supporting film according to an embodiment of the present disclosure.

In this embodiment, the solvent for selectively dissolving the top PS film is cyclohexene, and the polystyrene was dissolved, by the addition of a small amount of n-hexane followed by slow addition of cyclohexene. N-hexane has a low surface tension and density, and the composite film can be well spread at the interface of the solvent; in addition, n-hexane does not cause dissolution and damage to PS and PMMA, and has a very good mutual solubility with cyclohexene. The cyclohexene that was slowly added was dissolved with n-hexane, such that the upper PS film was dissolved slowly and uniformly. The composite film is in a very flat state throughout the process without wrinkles. The schematic diagram of the dissolution process is shown in FIG. 3. In FIG. 3, ref.1 indicates an electrolytic cell, ref.2 indicates an electrolyte solution, ref.3 indicates graphene, ref.4 indicates a PMMA film, ref.1 indicates a PS film, ref.6 indicates n-hexane, and ref.7 indicates cyclohexene; and the photo of the dissolution process is shown in FIG. 4.

The method may further comprise step S4: After washed with deionized water, the transfer process was completed, by using $Si/SiO_2$ as the target substrate and finally dissolving the thin PMMA film with acetone.

Figure 5:
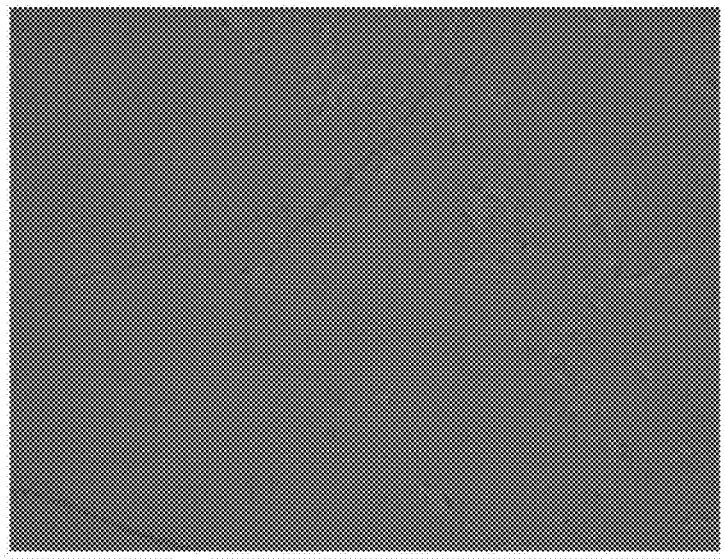
FIG. 5 illustrates an optical microscope photograph of graphene obtained by using a conventional electrochemical transfer technique.
Figure 6:
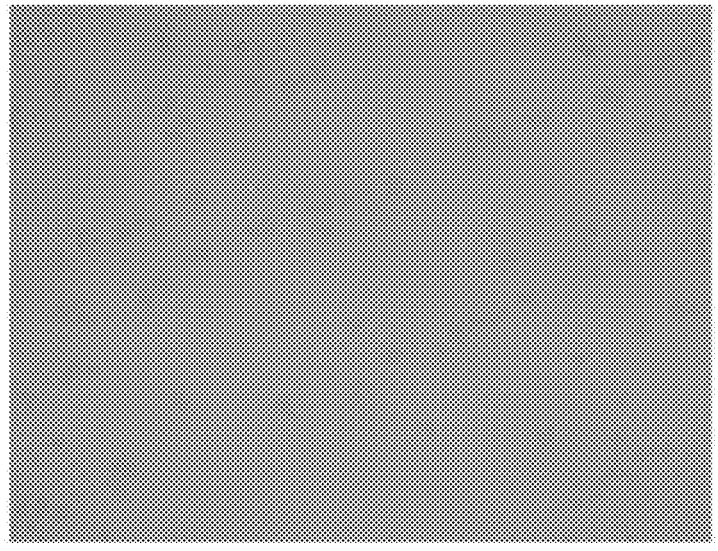
FIG. 6 illustrates an optical microscope photograph of graphene obtained by using the electrochemical transfer process assisted by multiple supporting films according to an embodiment of the present disclosure.

An optical microscope photograph of graphene obtained by a conventional electrochemical transfer process is shown in FIG. 5. As seen from FIG. 5, many wrinkles and holes were generated. The graphene obtained by the transfer method according to this embodiment, by contrast, maintained integrity, clean and no breakage occurred, which can be seen from the optical microscope photograph shown in FIG. 6.

While preferred embodiments of the present disclosure have been described herein, those skilled in the art can make additional changes and modifications to these embodiments once they know the basic inventive concepts. Therefore, the appended claims are intended to cover the preferred embodiments and all such variations and modifications as fall within the true spirit of the disclosure. It will be obvious that those skilled in the art can make various changes and variations to the present disclosure without departing from the spirit and scope of the present disclosure. Accordingly, if these modifications and variations of the present disclosure fall within the scope of the claims appended in the present disclosure and equivalents thereof, the present disclosure also intends to embrace these modifications and variations.

The invention claimed is:

1. A graphene electrochemical transfer method assisted by multiple supporting films, comprising:
    (1) growing graphene on a metal substrate, and then spin-coating a layer of photoresist on a surface of the graphene as a first film;
    (2) spin-coating n layers of selectively dissolvable polymer films on a surface of the first film as a top film, where $1 \leq n \leq 10$;
    (3) dissociating a multi-layer composite film and the graphene from the surface of the metal substrate by an electrochemical process, and dissolving the polymer films which are the top film with a first solvent, adding amount of N-hexane followed by addition of the first solvent, and the first solvent is a solvent capable of dissolving the top film without dissolving the first film, wherein the multi-layer composite film is flat without wrinkles; and
    (4) after washing, transferring the first film and the graphene to a target substrate, and finally dissolving the first film away with the use of a second solvent to complete the transfer process.

2. The graphene electrochemical transfer method assisted by multiple supporting films of claim 1, wherein the metal substrate is Cu, Ni, Co, Ir, Ru, Pd, Pt, or an alloy thereof.

3. The graphene electrochemical transfer method assisted by multiple supporting films of claim 1, wherein the layer of photoresist includes polymethyl methacrylate (PMMA), Polybisphenol A, polycarbonate (PC), or a double-layer film of polyvinyl alcohol (PVA) and PMMA.

4. The graphene electrochemical transfer method assisted by multiple supporting films of claim 3, wherein a thickness of the layer of photoresist is 100 nm-1000 nm.

5. The graphene electrochemical transfer method assisted by multiple supporting films of claim 3, wherein a thickness of the layer of photoresist is 200 nm.

6. The graphene electrochemical transfer method assisted by multiple supporting films of claim 1, wherein the top film includes polystyrene (PS) or dimethylsiloxane (PDMS).

7. The graphene electrochemical transfer method assisted by multiple supporting films of claim 6, wherein a thickness of the top film is 1-100 um.

8. The graphene electrochemical transfer method assisted by multiple supporting films of claim 6, wherein a thickness of the top film is 1 um.

9. The graphene electrochemical transfer method assisted by multiple supporting films of claim 1, wherein an electrolyte used in the electrochemical process for electrochemical stripping includes the aqueous solutions of $Na_2SO_4$, NaCl, NaOH, $K_2SO_4$, KCl or KOH; with electrolysis voltage of 2-20V.

10. The graphene electrochemical transfer method assisted by multiple supporting films of claim 1, wherein the target substrate includes $Si/SiO_2$, polymer or BN substrate.

11. The graphene electrochemical transfer method assisted by multiple supporting films of claim 1, wherein the first solvent is cyclohexene.

12. The graphene electrochemical transfer method assisted by multiple supporting films of claim 1, wherein the second solvent is acetone.

13. The graphene electrochemical transfer method assisted by multiple supporting films of claim 1, wherein the metal substrate is Cu.

14. The graphene electrochemical transfer method assisted by multiple supporting films of claim 1, wherein the layer of photoresist is a PMMA film.

15. The graphene electrochemical transfer method assisted by multiple supporting films of claim 1, wherein the top film includes Styrene (PS).

16. The graphene electrochemical transfer method assisted by multiple supporting films of claim 1, wherein an electrolyte used in the electrochemical process for electrochemical stripping is a $Na_2SO_4$ aqueous solution, and an electrolysis voltage is 3-4V.

17. The graphene electrochemical transfer method assisted by multiple supporting films of claim 1, wherein the target substrate includes $Si/SiCO_2$.

* * * * *